(12) United States Patent
Terhune et al.

(10) Patent No.: US 7,708,571 B2
(45) Date of Patent: May 4, 2010

(54) SOCKET ASSEMBLY WITH PICK UP CAP

(75) Inventors: Albert Terhune, Chandler, AZ (US);
Chia-Wei Fan, Tu-cheng (TW);
Nan-Hung Lin, Tu-cheng (TW);
Hao-Yun Ma, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/228,708

(22) Filed: Aug. 15, 2008

(65) Prior Publication Data

US 2010/0041249 A1    Feb. 18, 2010

(51) Int. Cl.
*H01R 13/44* (2006.01)

(52) U.S. Cl. ....................................... 439/135

(58) Field of Classification Search ................ 439/135, 439/940
See application file for complete search history.

(56) References Cited

U.S. PATENT DOCUMENTS

| | | | |
|---|---|---|---|
| 6,877,990 B2 | 4/2005 | Liao et al. | |
| 6,905,353 B2* | 6/2005 | Ma et al. | 439/135 |
| 7,001,197 B2 | 2/2006 | Shirai et al. | |
| 7,004,768 B2* | 2/2006 | Ma et al. | 439/135 |
| 7,014,488 B2* | 3/2006 | Stone | 439/331 |
| 7,029,295 B2* | 4/2006 | Liao | 439/135 |
| 7,033,188 B2* | 4/2006 | Ma | 439/135 |
| 7,070,427 B2* | 7/2006 | Liao et al. | 439/135 |
| 7,112,066 B2 | 9/2006 | Liao et al. | |
| 7,140,890 B1* | 11/2006 | Ju | 439/135 |
| 7,163,013 B2 | 1/2007 | Harrison | |
| 7,165,988 B2* | 1/2007 | Ma et al. | 439/331 |
| 7,182,620 B1 | 2/2007 | Ju | |
| 7,390,202 B2* | 6/2008 | Ma et al. | 439/135 |
| 7,429,181 B2* | 9/2008 | Liao | 439/135 |
| 7,429,182 B1* | 9/2008 | Zheng et al. | 439/135 |
| 2004/0175974 A1* | 9/2004 | Ma et al. | 439/135 |
| 2005/0014401 A1* | 1/2005 | Ma et al. | 439/135 |
| 2005/0014402 A1* | 1/2005 | Ma et al. | 439/135 |
| 2005/0090134 A1* | 4/2005 | Liao et al. | 439/135 |
| 2005/0112922 A1* | 5/2005 | Ma | 439/135 |
| 2005/0136711 A1* | 6/2005 | Ma | 439/135 |
| 2005/0208813 A1* | 9/2005 | Trout et al. | 439/326 |
| 2008/0009158 A1* | 1/2008 | Ma et al. | 439/135 |

* cited by examiner

*Primary Examiner*—T C Patel
*Assistant Examiner*—Vladimir Imas
(74) *Attorney, Agent, or Firm*—Andrew C. Cheng; Wei Te Chung; Ming Chieh Chang

(57) ABSTRACT

A socket assembly (1) in accordance with a preferred embodiment of the present invention comprises a socket body (20) holding a plurality of contacts therein, a pick up cap (22) fixed onto the socket body, and a loading plate (3) capable of moving between a closed position and a open position with regard to the socket body (20). A locking device (5) is proved to lock the loading plate (3) to a closed position. The pick up cap (22) comprises a flat suction surface (220) and at least one latch (222) for latching the loading plate (3) so that the pick up cap (22) can be attached to the loading plate (3) when the loading plate (3) is in a closed position, and detached from the socket body (20) when the loading plate (3) moves away from the socket body to an open position.

13 Claims, 5 Drawing Sheets ical contacts received in the housing, a metal clip pivotally
SOCKET ASSEMBLY WITH PICK UP CAP

BACKGROUND OF THE INVENTION

1. Field of the Invention

The present invention relates to a socket assembly, and particularly to a socket assembly employs a pick up cap, where the pick up cap can be removed away from a socket body when a loading plate is moved to an open position.

2. Description of Related Art

On many production lines, electronic components such as IC package socket connectors are accurately positioned on circuit substrates such as printed circuit boards (PCBs) by means of vacuum suction devices. Such a socket connector typically comprises an insulative housing, a plurality of electrical contacts received in the housing, a metal clip pivotally mounted to an end of the housing, and a lever pivotally mounted to an opposite end of the housing for engaging with the clip. The clip has a generally rectangular window in a middle portion thereof. The contacts each have first contact portions protruding outwardly from a top portion of the housing, for electrically connecting with a multiplicity of metal contact pads of an electronic package such as a central processing unit (CPU).

U.S. Pat. No. 6,877,990 issued to "Hon Hai" on Apr. 12, 2005, disclosed an electrical connector with a pick up cap attached to a top surface of a clip. The pick up cap typically has a plurality of latches snappingly engaging with corresponding outer edges of the clip, thereby mounting the pick up cap onto the electrical connector. The vacuum suction device is then able to engage on the flat top surface of the pick up cap, in order to reliably move and accurately position the whole electrical connector onto the PCB.

The pick up cap attached onto the clip is adapted to the electrical connector, in which the housing and the clip are assembled as a whole. However, if the housing and the clip are shipped and mounted separately from each other, the housing, to which there's no pick up arrangement attached, is impossible to be still moved and mounted to the PCB by a suction device.

Apparently, certain modifications could be made to above mentioned pick up cap design. For example, the pick up cap should be directly fixed to the housing and is therefore able to move and mount the housing to the PCB by a suction device. However, since the clip is usually need to be operated for multi-times from a closed position to an open position, and then the CPU is placed onto the housing or taken away from the housing, the pick up cap is accordingly needed to be manually mounted on or detached from the housing for each time. Thereby, the process is complicated and tedious.

In view of the above, a new socket assembly with improved pick up cap which overcomes the above-mentioned disadvantages is desired.

SUMMARY OF THE INVENTION

Accordingly, an object of the present invention is to provide a socket assembly having a pick up cap.

Further, another object of the present invention is to provide a socket having a pick up cap.

To achieve the above first object, a socket assembly made in accordance with a preferred embodiment of the present invention is provided, the socket assembly comprises a socket body holding a plurality of contacts therein, a pick up cap removable attached onto the socket body, the picking up cap comprising a flat suction surface, a loading plate and a locking device for locking the loading plate to a closed position. The loading plate is engaging with the pick up cap when moves toward the socket body, and removes the pick up cap from the socket body when the loading plate moves away from the socket body.

To achieve the above second object, a socket made in accordance with a preferred embodiment of the present invention is provided for engaging with a loading plate, which is capable of moving between a closed position and an open position with regard to the socket. The socket comprises a socket body holding a plurality of contacts therein, a pick up cap fixed onto the socket body. The pick up cap comprises a flat suction surface, clasps for latching the socket body and at least one latch for latching the loading plate. When the loading plate is operated from the closed position to the open position, the pick up cap is detached from the socket body and moves together with the loading plate.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
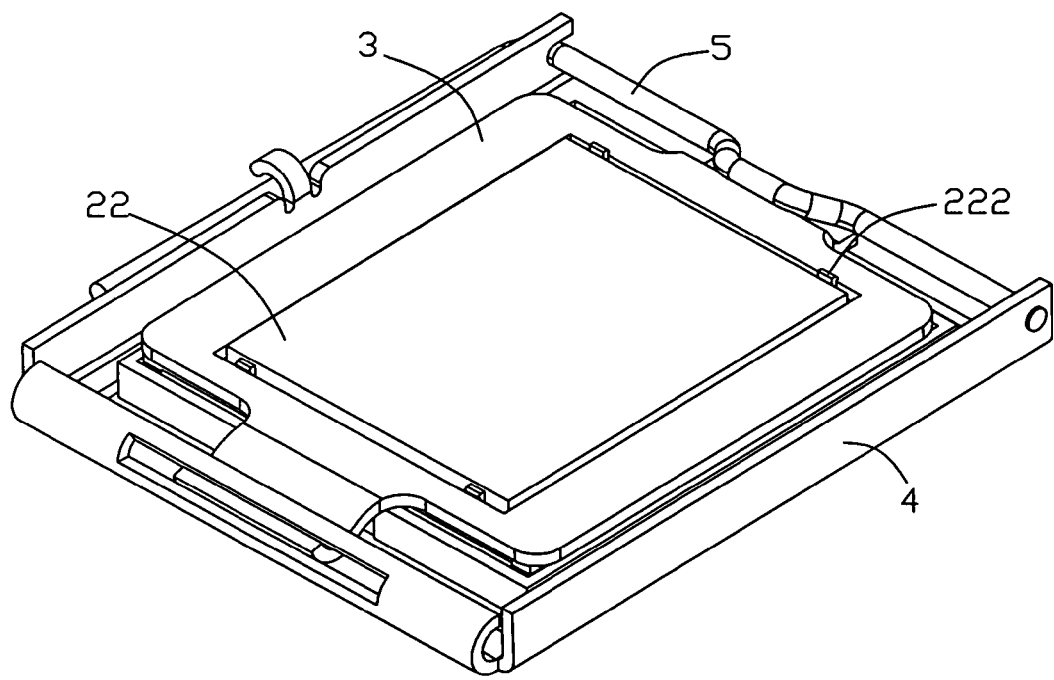
FIG. 1 is an assembled, perspective view of the socket assembly with a loading plate in a closed position, in accordance with the preferred embodiment of the present invention.
Figure 2:
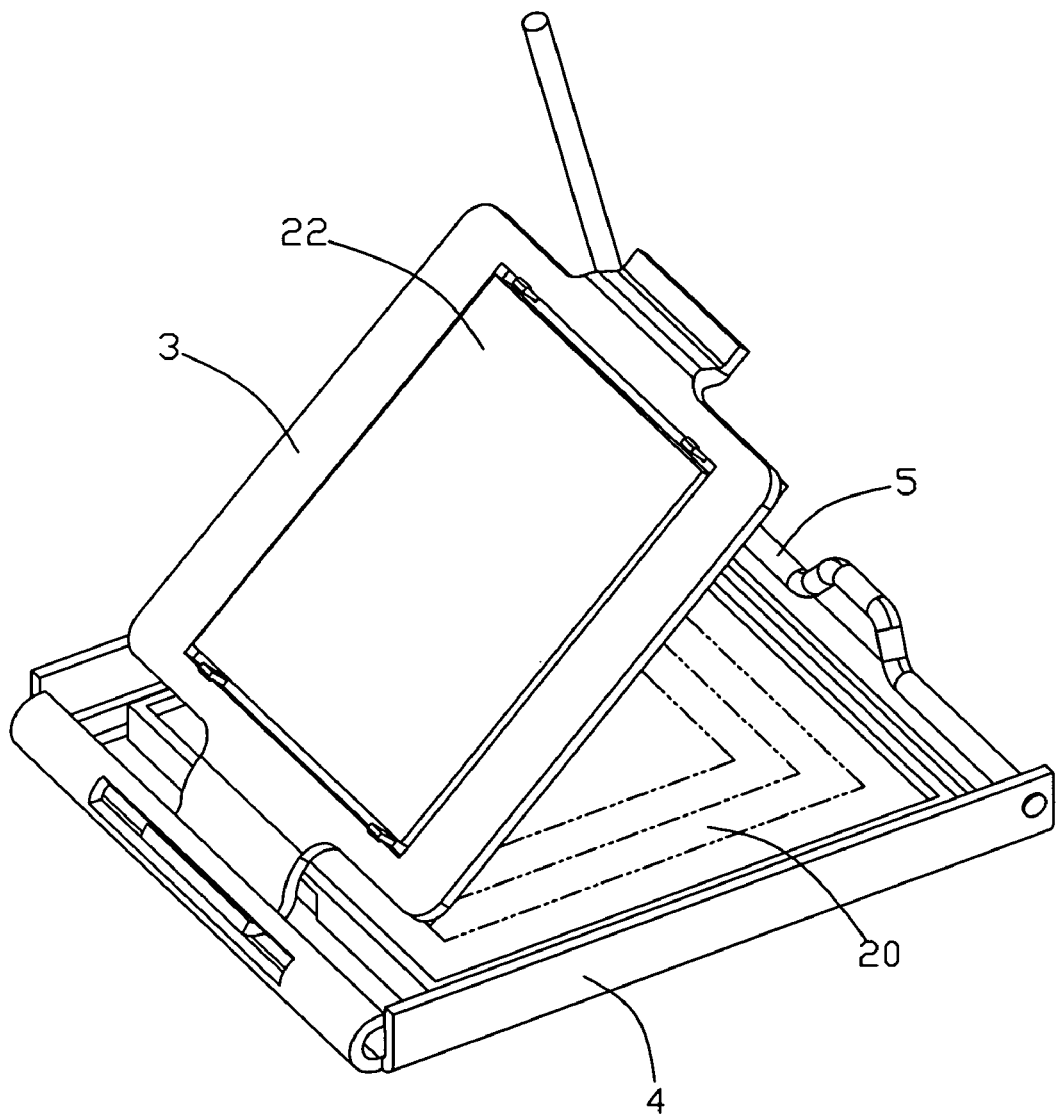
FIG. 2 is an assembled, perspective view of the socket assembly, with the loading plate in an open position.
Figure 3:
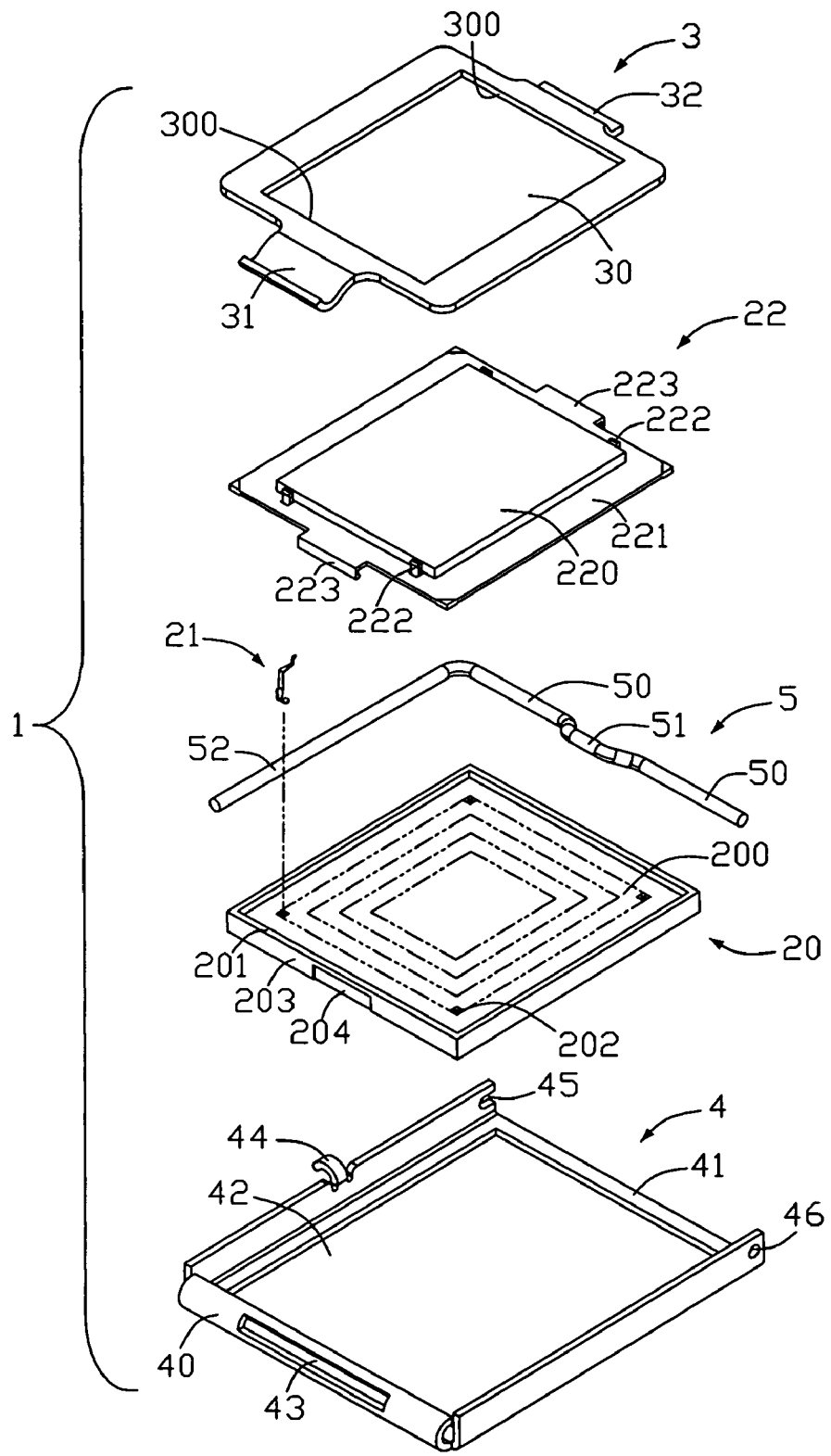
FIG. 3 is an exploded, perspective view of the socket assembly.

FIG. 1 is an assembled, perspective view of the socket assembly 1 in accordance with a preferred embodiment of the present invention, in which a loading plate 3 is in a closed position. FIG. 2 is also an assembled view of the socket assembly 1, in which the loading plate 3 is operated to an open position. FIG. 3 is an exploded view of the socket assembly 1. The socket assembly 1 is commonly mounted onto a printed circuit board (PCB) (not shown) and comprises a socket 2, a positioning frame 4 mounted onto the PCB and locating at periphery of the socket 2, a loading plate 3 pivotally mounted onto a first end 40 of the positioning frame 4, and a lever 5 working as a locking device pivotally mounted to an opposite second end 41 of the positioning frame 4 for locking the loading plate 3 to the closed position. The socket 2 further comprises a socket body 20, a plurality of contacts 21 held in the socket body 20, and a pick up cap 22 mounted and fixed onto the socket body 20.

Figure 4:
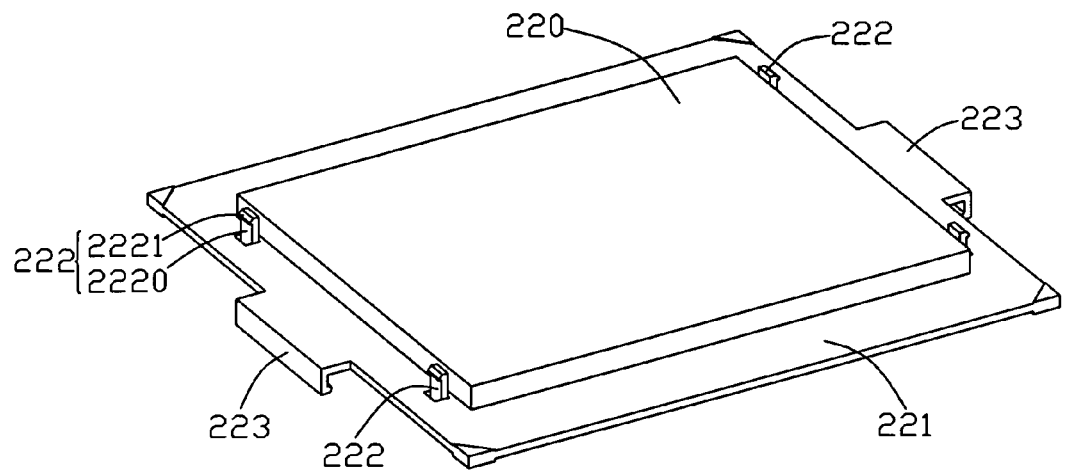
FIG. 4 is a perspective view of a pick up cap of the socket assembly.
Figure 5:
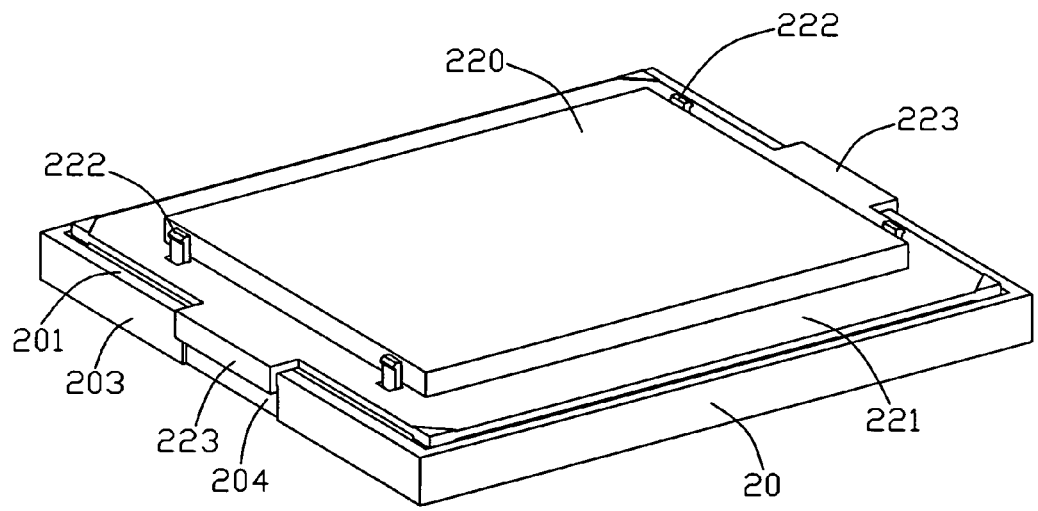
FIG. 5 is an assembled, perspective view of the pick up cap and a socket body, on which the pick up cap is mounted.

FIG. 4 illustrates the pick up cap 22 of the socket assembly 1, and FIG. 5 illustrates the pick up cap 22 mounted onto the socket body 20. Referring to FIG. 3 and FIG. 4, the socket body 20 is molded from an insulative material such as synthetic resin or the like, and is of a substantially rectangular plate shape. The socket body 20 has an IC package receiving cavity 200 formed in its upper surface, which is defined by four outer peripheral walls 201. A number of passageways 202, in which the contacts 21 are received, are formed in a matrix. However, only one contact 3 is illustrated in FIG. 2, and the rest are omitted. A pair of recesses 204, for engaging with the pick up cap 22, are respectively formed on side surfaces 203 of two opposite peripheral walls 201. The manner of engagement between the pick up cap 22 and the recesses 204 will be described below.

The pick up cap 22 is integrally molded from synthetic resin or the like, and has a substantially rectangular shape. As shown in FIG. 4, the pick up cap 22 comprises a flat suction surface 220 and a flange 221, from which the suction surface 220 protrudes upward. The flange 221 extends outward, and substantially parallel to the suction surface 220. Latches 222, for latching the loading plate 3, extend upward from the flange 221, in the vicinities of four corners of the suction surface 220. Each latch 222 includes a spring arm 2220, and a latching protrusion 2221 extending from a free end of the spring arm 2220 in a direction away form the suction surface 220. A pair of elastic clasps 223, extending downward from two opposite edges of the flange 221, are located respectively corresponding to the recesses 204 on the socket body 20. When the pick up cap 22 is mounted and fixed to the socket body 20, the clasps 223 are positioned in and engaging the recesses 204 and the pick up cap 22 is therefore fixed onto the socket body 20. The pick up cap 22 is detachable from the socket body 20 due to its deformability.

The positioning frame 4 should be formed by punching and bending a single metal plate, and is of a rectangular shape. A rectangular opening 42, for receiving the socket body 20, is formed in the central portion of the positioning frame 4. An elongated rectangular opening 43 is formed at the first end 40. The loading plate 3 engages with the opening 43 so that it is pivotable with regard to the positioning frame 4. An engaging protrusion 44, for engaging the lever 5, is integrally formed from a lateral side of the position frame 4. The distal end of the protrusion 44 is bent downward to prevent the lever 5 from being disengaged form the protrusion 44. A notch 45 and a hole 46 are respectively formed at ends of two opposite lateral sides of the positioning frame 4 so as to support the lever 5 and prevent the lever 5 from moving away. The positioning frame 4 is able to be mounted to the PCB by screws or other manners. The socket body 20 substantially disengages with the positioning frame 4, and thereby there is no substantial engagement or interference between the positioning frame 4 and the socket body 20 when they are assembled to the PCB.

The lever 5 includes two rotational shafts 50 and a locking portion 51, which is between the rotational shafts 50 and is offset from the axis of the two shafts 50; and an operating arm 52, for rotating the rotational shafts 50. The operating arm 52 is bent perpendicular from the rotational shafts 50. One portion of the operating arm 52 is locked by the protrusion 44 on the positioning frame 4.

Figure 6:
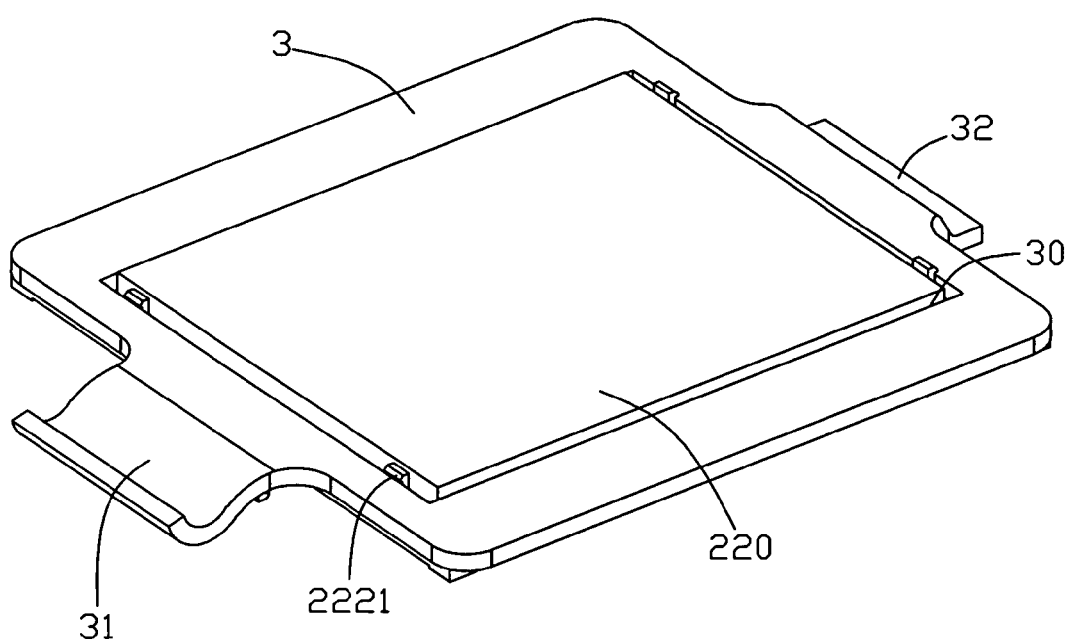
FIG. 6 is an assembled, perspective view of the pick up cap and a loading plate, to which the pick up cap is attached.

Referring to FIG. 3 and FIG. 6, the loading plate 3 is of a rectangular shape and may be formed by punching and bending a single metal plate. A rectangular opening 30, in which an IC package or the suction surface 220 of the pick up cap 22 is positioned, is formed in the central portion of the loading plate 3. The opening 30 has inner edges 300, which engage the latches 222 on the pick up cap 22, so that the pick up cap 22 is able to be attached to the loading plate 3. A curving bearing tongue 31 protrudes at the front of the loading plate 3. The distal end of the bearing tongue 31 extends upward. The bearing tongue 31 engages the opening 43 on the first end 40 of the positioning frame 4. Thereby, the loading plate 3 is supported by the positioning frame 4 so that it is pivotable with respect thereto. A locking piece 32, which extends from the rear of the loading plate 3, is configured to engage the locking portion 51 of the lever 5.

Referring to FIG. 5, the pick up cap 22 is mounted and fixed onto the socket body 20 to together form as a socket 2, and then the socket 2 should be shipped as an individual product. When the socket 2 is mounted onto the PCB, a suction device sucks the pick up cap 22 to lift up the socket 20, and place it at a predetermined position on the PCB. The positioning frame 4 and the loading plate 3 can be mounted onto the PCB before or after the mounting of the socket 2.

When the loading plate 3 is operated from the open position toward the socket 2 and almost reach the pick up cap 22 on the socket body 20, the latches 222 engage the inner edges 300 of the opening 30 of the loading plate 3. The spring arms 2220 slightly deform until the latching protrusions 2221 protrude on a top surface of the loading plate 3, so that the pick up cap 22 is attached and fixed to the loading plate 3. When the loading plate 3 is then reversely operated to the open position, the pick up cap 22 is detached from the socket body by the loading plate 3, and moves together with the loading plate 3, so that automatic removal of the pick up cap 22 is achieved, without manually taking the pick up cap 22 away from the socket body 20. Obviously, the engaging force between the pick up cap 22 and the loading plate 3 should be greater than that between the pick up cap 22 and the socket body 20.

Note that the present invention is not limited to the embodiment described above. Various modifications are possible. For example, the positioning frame 4 is not necessary and is able to be omitted. In that case, another manner of locking means is to be adopted, for example, a screw directly locking at the locking piece 32 to fix the loading plate 3 onto the PCB.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. A socket assembly comprising:
a socket body holding a plurality of contacts therein;
a pick up cap removable attached onto the socket body, the picking up cap comprising a flat suction surface;
a loading plate engaging with the pick up cap when moves toward the socket body, and removing the pick up cap from the socket body when the loading plate moves away from the socket body; and
a locking device for locking the loading plate to a closed position;
wherein the loading plate defines an inner surface toward the socket body and an outer surface opposite away from the socket body, the pick up cap being attached to the loading plate from the inner surface.

2. The socket assembly as claimed in claim 1, wherein the pick up has clasps for latching the socket body and at least one latch for latching the loading plate.

3. The socket assembly as claimed in claim 2, further comprising a positioning frame having an opening for receiving the socket body.

4. The socket assembly as claimed in claim 3, wherein the locking device is of a lever manner, and is pivotally mounted to one end of the positioning frame.

5. The socket assembly as claimed in claim 4, wherein the socket body substantially disengages with the positioning frame, and thereby there is no substantial engagement or interference between the positioning frame and the socket body.

6. The socket assembly as claimed in claim 2, wherein the loading plate has a rectangular opening, in which an IC package or the suction surface of the pick up cap is positioned.

7. The socket assembly as claimed in claim 6, wherein the pick up cap further has a flange, from which the suction surface protrudes upward, said at least one latch being extending upward from the flange.

8. The socket assembly as claimed in claim 7, wherein the latch of the pick up cap comprises a spring arm and a latch protrusion extending from a free end of the spring arm, the latch engaging with an inner edge of the opening of the loading plate.

9. The socket assembly as claimed in claim 8, wherein four said latches are provided on the pick up cap to be located in the vicinity of corners of the suction surface.

10. A socket for engaging with a loading plate, the loading plate being capable of moving between a closed position and an open position with regard to the socket, the socket comprising:

a socket body holding a plurality of contacts therein;

a pick up cap fixed onto the socket body, the pick up cap comprising a flat suction surface, clasps for latching the socket body and at least one latch for latching the loading plate;

wherein the pick up cap is grasped by the loading plate automatically without manual or machine operation and then moves along with the loading plate during the loading plate is moving from the closed position to the open position;

wherein the pick up cap has a flange, from which the suction surface protrudes upward, the clasps and said at least one latch being extending respectively downward and upward from the flange.

11. The socket as claimed in claim 10, wherein the latch of the pick up cap comprises a spring arm and a latch protrusion extending from a free end of the spring arm in a direction away from the suction surface, the latch engaging with an inner edge of an opening of the loading plate.

12. The socket as claimed in claim 11, wherein four said latches are provided to be located in the vicinity of corners of the suction surface.

13. The socket as claimed in claim 12, wherein engaging force between the loading plate and the pick up cap is greater than that between the socket body and the pick up cap.

\* \* \* \* \*